(12) United States Patent
Hase

(10) Patent No.: US 7,116,397 B2
(45) Date of Patent: Oct. 3, 2006

(54) EXPOSURE APPARATUS AND DEVICE MANUFACTURING METHOD

(75) Inventor: Tomoharu Hase, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 11 days.

(21) Appl. No.: 11/288,104

(22) Filed: Nov. 29, 2005

(65) Prior Publication Data

US 2006/0077362 A1    Apr. 13, 2006

Related U.S. Application Data

(60) Division of application No. 11/151,338, filed on Jun. 14, 2005, now Pat. No. 6,999,159, which is a continuation of application No. 10/936,790, filed on Sep. 9, 2004, now Pat. No. 6,967,706, which is a division of application No. 09/145,982, filed on Sep. 3, 1998, now Pat. No. 6,853,439.

(30) Foreign Application Priority Data

Sep. 4, 1997  (JP)  .................................. 9-254130
Jul. 21, 1998  (JP)  .................................. 10-219906

(51) Int. Cl.
  G03B 27/52  (2006.01)
  G03B 27/42  (2006.01)
(52) U.S. Cl. .......................................... 355/30; 355/53

(58) Field of Classification Search .................. 355/30, 355/53, 55, 67–71; 359/611–620, 811–820
See application file for complete search history.

(56) References Cited

U.S. PATENT DOCUMENTS

| | | | |
|---|---|---|---|
| 4,690,528 A | * | 9/1987 | Tanimoto et al. ........... 353/101 |
| 4,704,348 A | | 11/1987 | Koizumi et al. ............ 430/327 |
| 4,725,126 A | * | 2/1988 | Siga et al. .................. 359/819 |
| 4,786,947 A | | 11/1988 | Kosugi et al. ................ 355/30 |
| 4,825,247 A | | 4/1989 | Kemi et al. ................... 355/55 |
| 5,221,822 A | | 6/1993 | Duny ...................... 219/121.63 |
| 5,227,605 A | | 7/1993 | Boudot et al. ......... 219/121.63 |
| 5,696,623 A | | 12/1997 | Fujie et al. ................. 359/350 |
| 5,812,242 A | | 9/1998 | Tokuda ........................ 355/30 |
| 5,838,426 A | | 11/1998 | Shinonaga et al. ........... 355/52 |
| 5,883,704 A | | 3/1999 | Nishi et al. ................... 355/67 |
| 6,853,439 B1 | | 2/2005 | Hase .......................... 355/30 |
| 2005/0030499 A1 | | 2/2005 | Hase .......................... 355/30 |

FOREIGN PATENT DOCUMENTS

JP  6-216000  8/1994

* cited by examiner

*Primary Examiner*—Henry Hung Nguyen
(74) *Attorney, Agent, or Firm*—Fitzpatrick, Cella, Harper & Scinto

(57) ABSTRACT

An exposure apparatus includes an optical system having a first optical element, for directing light from a light source to a member to be exposed. The first optical element serves to separate first and second spaces inside the optical system, and the first optical element has a first notch formed at an end portion outside an effective light flux of light from the light source.

3 Claims, 8 Drawing Sheets

EXPOSURE APPARATUS AND DEVICE MANUFACTURING METHOD

This application is a divisional application of patent application Ser. No. 11/151,338, filed Jun. 14, 2005, which is now U.S. Pat. No. 6,999,159, which is a continuation of U.S. patent application Ser. No. 10/936,790, filed Sep. 9, 2004, which issued as U.S. Pat. No. 6,967,706 on Nov. 22, 2005, and is a divisional of patent application Ser. No. 09/145,982, filed Sep. 3, 1998, which issued as U.S. Pat. No. 6,853,439 on Feb. 8, 2005.

FIELD OF THE INVENTION AND RELATED ART

This invention relates to an exposure apparatus and a device manufacturing method. More particularly, the invention is concerned with an exposure apparatus for use in an exposure process for the manufacture of various devices such as semiconductor devices (e.g., ICs or LSIs), image pickup devices (e.g., CCDs), display devices (e.g., liquid crystal panels), or sensors (e.g., magnetic heads), for example, and it is concerned with a device manufacturing method for manufacturing devices such as described above.

For further increases of integration and operation speed of a solid device such as an LSI, for example, miniaturization of a circuit pattern is being advanced. Currently, pattern formation uses a lithographic process which is based on a reduction projection exposure method having superiority in productivity and resolution performance. In this method, a circuit pattern of a mask is simultaneously transferred to a workpiece such as a semiconductor wafer by use of a projection lens. The limit resolution performance is proportional to the wavelength of exposure light and is in inverse proportion to the numerical aperture (NA) of the projection lens. In consideration of this, improvement of resolution has been attempted by enlargement of the numerical aperture of the projection lens. However, further miniaturization of semiconductor devices needs shortening of the wavelength of the exposure light.

Recently, in addition to illumination light of a Hg lamp of e-line (wavelength $\lambda$=546 nm), g-line ($\lambda$=435 nm), h-line ($\lambda$=405 nm) or i-line ($\lambda$=365 nm), short wavelength excimer lasers (e.g., a KrF excimer laser with $\lambda$=248 nm) are used practically in an exposure apparatus.

Even if a high resolution projection lens and a short wavelength and high luminance light source are used, uniform resolution is not attainable over the whole circuit pattern image as printed on a wafer unless the illuminance distribution (light intensity distribution) of light illuminating the photomask is not uniform. Thus, good pattern printing is not accomplished. For this reason, an illumination optical system of a projection exposure apparatus must provide illuminance uniformness of illumination light to be projected to a mask surface, to assure uniform exposure over the whole printing surface. To this end, conventionally, an illumination optical system is disposed between a light source and a mask surface, which optical system comprises a condenser lens and an optical integrator including an optical fiber bundle or a lens array called a fly's eye lens. In excimer laser exposure apparatuses, as a result of the use of a larger numerical aperture of a projection lens and a shorter wavelength of light source for higher resolution precision and productivity, it is much more important to maintain illuminance uniformness (not greater than ±1%) than in other exposure apparatuses.

However, practically, it is very difficult to maintain illuminance uniformness of not greater than ±1% for a long time period.

Short wavelength exposure light such as described above may be extracted out of a wide bandwidth range of a light source, comprising a Hg lamp, for example, by use of a filter for transmitting only a desired wavelength or a wavelength selective thin film (optical thin film deposited on a lens surface or a mirror surface for transmitting or reflecting a desired wavelength only). Exposure light emitted from a light source goes through an illumination optical system for illuminating a reticle and a projection optical system (projection lens) for imaging a fine pattern, as formed on the reticle, upon a photosensitive substrate, by which transfer and printing of the fine pattern onto the photosensitive substrate is performed. In exposure apparatuses, because of miniaturization of the pattern line width, improvements of throughput and resolution are required, and this necessitates the use of higher power exposure light and, additionally, a narrowed bandwidth of exposure light.

It is known that, in an exposure apparatus using exposure light of i-line (wavelength $\lambda$=365 nm) and an exposure apparatus using exposure light of a wavelength shorter than the i-line, as a result of the shortening of the wavelength, the exposure light causes an opto-chemical reaction between oxygen and impurities in the air. There is an inconvenience that the product (blurring materials) created by this reaction adheres to a glass material to cause an opaque "blur" on the glass material. As for such a blurring material, there may be ammonium sulfate $(NH_4)_2SO_4$, as a representative, which can be produced when, for example, sulfurous acid $SO_2$ absorbs energy of the light and turns into an excited state such that it reacts with oxygen in the air (i.e., is oxidized). Such ammonium sulfate bears a white color, and it produces a "blur" when deposited on the surface of an optical component such as a lens or a mirror. In that case, the exposure light is scattered or absorbed by the ammonium sulfate and, as a result, the transmission factor of the optical system decreases.

Particularly, in the short wavelength region as that of a KrF excimer laser, for example, wherein the exposure light has a wavelength of about 248 nm, which is shorter than the i-line, the exposure light may cause a strong opto-chemical reaction. In addition to production of "blur" as described above, there may be a phenomenon that the exposure light causes a further reaction of oxygen in the air to produce ozone such that both residual oxygen and produced ozone absorb the exposure light. This results in a further decrease of the light quantity (transmission factor) of exposure light, which can reach the photosensitive substrate, and it causes a reduction of throughput. Japanese Laid-Open Patent Application, Laid-Open No. 216000/1994 proposes the use of a casing of a sealingly closed structure which accommodates therein a barrel containing a glass member such as a lens, for example, the inside of the casing being filled with an inert gas to keep a low oxygen density to thereby prevent ozone generation.

With this method, however, attenuation or variation of exposure light resulting from absorption of exposure light by "blur" or ozone cannot be prevented sufficiently.

SUMMARY OF THE INVENTION

It is accordingly an object of the present invention to provide an exposure apparatus and/or a device manufacturing method by which any change in illuminance or illuminance non-uniformness can be suppressed such that a substrate can be exposed constantly with a correct exposure amount.

In accordance with an aspect of the present invention, there is provided an exposure apparatus comprising: an illumination optical system for illuminating an original with ultraviolet light; a projection optical system for projecting a pattern of the original onto a substrate to be exposed; and gas purging means for replacing an inside space, where optical components of at least one said illumination optical system and said projection optical system are placed, with a gas containing substantially no moisture or water content.

In accordance with another aspect of the present invention, there is provided an exposure apparatus, comprising: an illumination optical system for illuminating an original with ultraviolet light; a projection optical system for projecting a pattern of the original onto a substrate to be exposed; gas purging means for replacing an inside space, where optical components of at least one of said illumination optical system and said projection optical system are placed, with a particular gas; and passage means for mutually communicating spaces separated by said optical components, for gas purging.

In an illumination optical system or a projection optical system of a reduction projection exposure apparatus, an anti-reflection film (optical thin film) is formed on the surface of an optical element such as a transparent plate, a lens or a prism, for example. The provision of such an anti-reflection film is to efficiently direct light from a light source to a photosensitive substrate and also to prevent impingement of a flare or ghost on the photosensitive substrate. However, due to the property, such anti-reflection film may easily absorb the water content of gas. With an anti-reflection film having a water content adhered thereto, the spectral reflection characteristic on the surface thereof or the absorption coefficient on the surface may change by a small amount, causing a change in the spectral transmission factor. Usually, an illumination optical system and a projection optical system have optical elements with surfaces of a number of several tens in total. Thus, even if the change in spectral transmission factor per one surface is small, there may be a large change of spectral transmission factor in the whole optical system.

In accordance with the first aspect of the present invention, the ambience of optical components of the illumination optical system or the projection optical system may be replaced by a gas having substantially no water content, by gas purging. This is effective to prevent a change in transmission factor of the whole optical system (i.e., a change in illuminance or illuminance non-uniformness) resulting from a change in spectral transmission factor due to adhesion of water content to optical elements such as described above. Thus, a substrate can be exposed constantly with a correct exposure amount.

Absorption of exposure light or generation of "blur" material in a case where oxygen or ozone is present along the light path may be solved by accommodating optical components such as lenses in a casing of a sealingly closed structure and by filling the casing inside with an inert gas to thereby keep a low oxygen density. However, in a barrel where lenses are placed, there are spaces which are separated by lenses and the barrel structure. Proper gas replacement cannot always be done within these spaces. Namely, it is not easy to effectively prevent absorption of exposure light or generation of "blur" material.

In accordance with the second aspect of the present invention, the ambience of optical components of the illumination optical system or the projection optical system may be replaced by an inert gas, by gas purging. Additionally, there may be passage means communicated with the casing inside or the barrel inside, by which a low oxygen density can be kept within the space where glass materials are placed. This effectively prevents an oxidization reaction during an opto-chemical reaction process, and avoids generation of a resultant product (blurring material). Additionally, it effectively prevents or reduces ozone generation due to reaction of oxygen by exposure light.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 4 is a graph for explaining changes in transmission factor with respect to time, in a case wherein laser irradiation and gas purging are not performed and the apparatus is left for a while.

DESCRIPTION OF THE PREFERRED EMBODIMENTS

Figure 1:
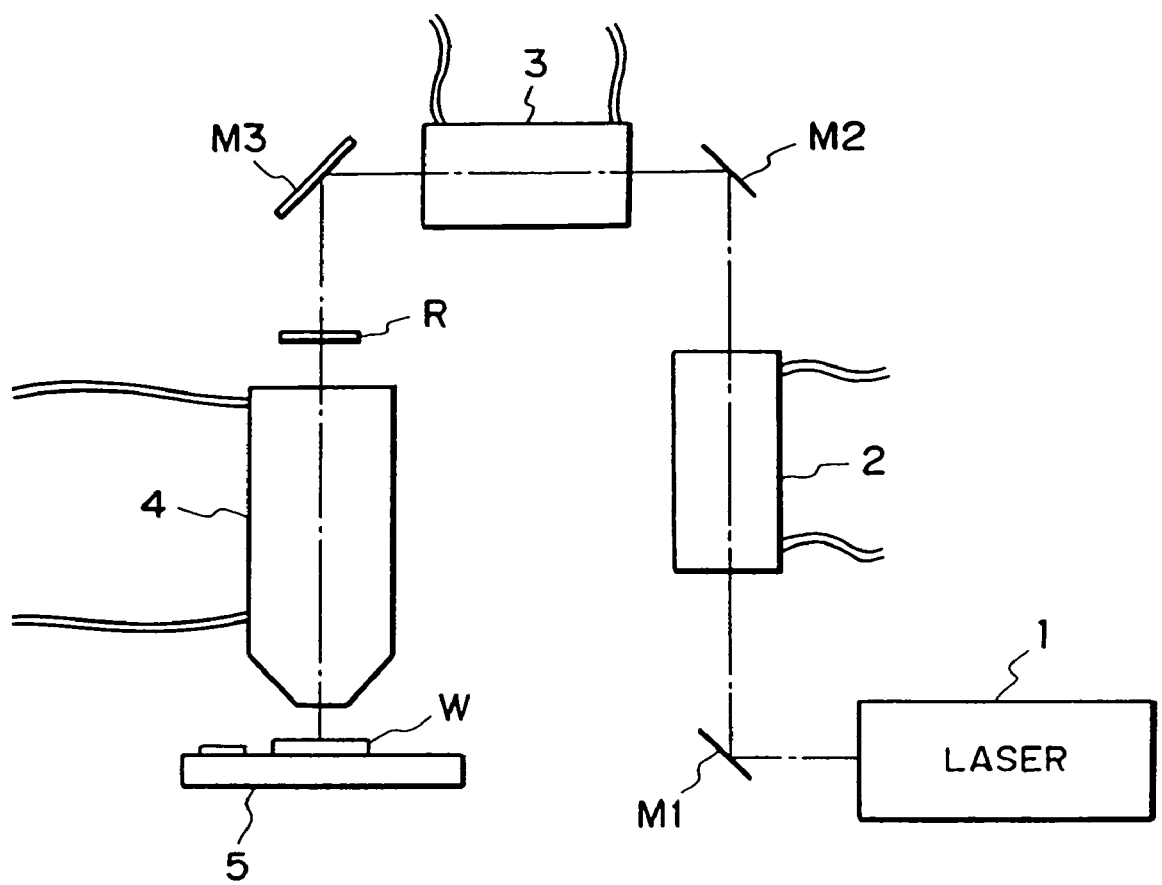
FIG. 1 is a schematic view of a general structure of a projection exposure apparatus according to an embodiment of the present invention.

A reduction projection exposure apparatus according to an embodiment of the present invention may comprise means for replacing an ambient air of optical components of an illumination optical system and/or a projection optical system with a gas such as $N_2$ gas, He gas, or dry air, for example. This is effective to decrease the humidity inside the optical system, in order to reduce adhesion of moisture (water content). Thus, a change in spectral reflection factor of anti-reflection films can be prevented, and the transmission factor of the optical system can be maintained substantially constant.

A sensor, such as a humidity sensor, for example, for detecting the level of replacement by the gas purging may be provided inside the optical system, and the gas purging may be controlled on the basis of a signal from the sensor.

For efficient gas purging, an inlet port and an outlet port for the purging gas inside the optical system may be disposed along a non-straight line.

In each optical system, support members for supporting lenses are provided with passages for gas purging, which passages are so formed that in adjacent support members, the passages are not aligned along a straight line. This assures higher replacement efficiency inside the barrel.

A reduction projection exposure apparatus according to another embodiment of the present invention may provide an exposure apparatus wherein a mask is illuminated with exposure light from a light source through an illumination optical system and wherein a pattern formed on the mask is projected onto a photosensitive substrate through a projection optical system. The exposure apparatus may include an optical element or elements disposed on a light path of exposure light from the exposure light source to the photosensitive substrate, and a casing for accommodating the optical element or elements therein. The optical element or each optical element is formed with a notch for positively defining a flow passage of gas between spaces inside the casing, being separated by the optical element.

In order to accomplish the second aspect of the invention, as an example, within the barrel where a number of lenses may be placed, the lens supports may be provided with flow passages for causing inert gas to flow into every space as separated by the lenses. Alternatively, pipe means may be used to define a flow passage outside the barrel.

On the other hand, as a result of further miniaturization and further enlargement of throughput, projection exposure apparatuses have become bulky and complicated. Thus, for every unit, saving as much space as possible is desired. In this respect, if a flow passage is formed in the lens support, the diameter of the barrel with respect to the effective light flux becomes larger. Further, using pipe means to provide a flow passage outside the barrel leads to undesirable complexity and increase of cost.

In the above embodiment, in consideration of this, an end portion of a lens is cut to save the space. More specifically, a notch may be defined outside the effective range of a lens or optical component which is used when in a projection exposure apparatus a reticle is illuminated with exposure light from a light source so that a pattern of the reticle is transferred to a wafer through a projection lens. This may be done to assure a flow passage for inert gas. This enables provision of a flow passage without use of specific components of pipe means and without enlargement of the barrel diameter. In recent years, scan type projection exposure apparatuses have been practically developed. For these exposure apparatuses, since the effective light flux is small as compared with the projection exposure apparatus, the design may be easier.

Preferred embodiments of the present invention will now be described in conjunction with the drawings.

FIG. 1 is a schematic view of a general structure of a projection exposure apparatus according to a first embodiment of the present invention. Denoted in the drawing at 1 is a light source, which may comprise an excimer laser of KrF (248 nm), ArF (193 nm) or $F_2$ (157 nm), for example. Denoted at 2 and 3 are illumination optical systems. Denoted at M1, M2 and M3 are deflecting mirrors. The illumination optical system 2 or 3 may include a beam shaping optical system for shaping and incoherency transforming the laser light from the light source 1, as well as a fly's eye lens for defining secondary light sources and a condenser lens, for example. The light from the illumination optical system 3 is projected to a reticle R, such that the reticle is projected onto a photosensitive substrate (wafer) W by means of a projection optical system 4. Denoted at 5 is an X-Y stage for holding the photosensitive substrate W, and it performs two-dimensional stepwise motion in the X and Y directions. Each of the illumination optical systems 2 and 3 and the projection optical system 4 is provided with a gas supply tube and a gas discharging tube for replacing and purging the gas within the inside space thereof.

Figure 2:
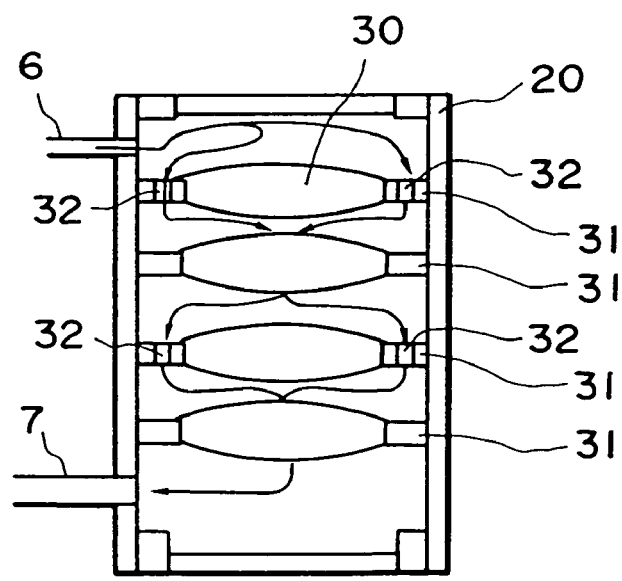
FIG. 2 is a schematic view of an inside structure of an illumination optical system or a projection optical system.
Figure 3:
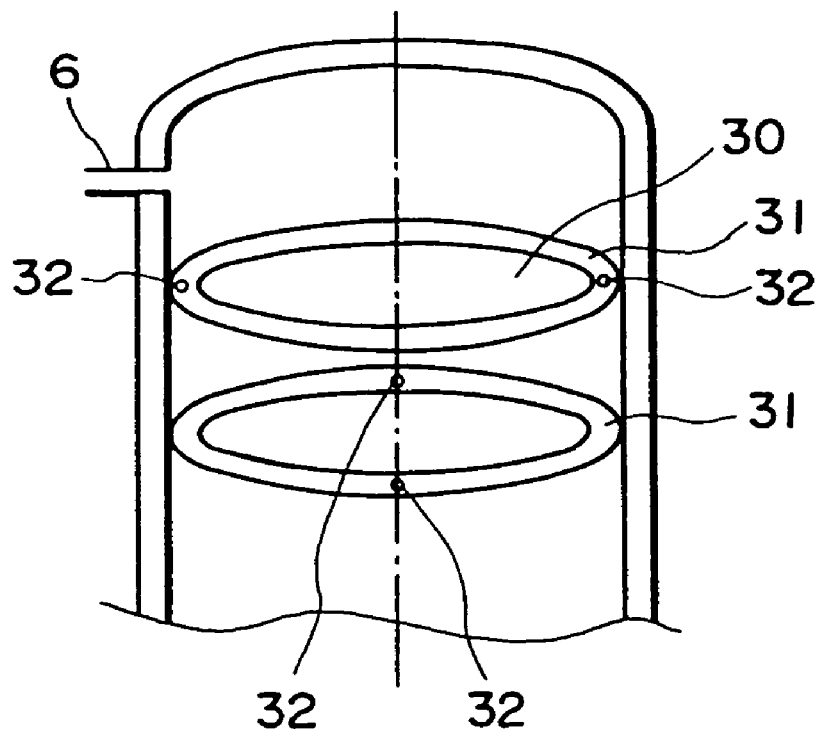
FIG. 3 is a schematic view for explaining passage of a purging air inside an illumination optical system or a projection optical system.

FIGS. 2 and 3 show the structure in the inside space of the illumination optical system 2 or 3 of the projection optical system 4. A casing 20 for the optical system is provided with an inlet port 6 and an outlet port 7, which are formed in a side wall of the casing and to which tubes for gas purging are connected. Inside the casing 20, lenses 30 are supported by lens support members 31, respectively. For efficient and uniform replacement of the whole inside space with purging air, each lens support 31 is formed with bores to provide purging air passages 32, which are so disposed that at adjacent lenses, the passages 32 are not aligned along a straight line. Namely, a straight line connecting the passages 32 of adjacent lens supports 31 is out of parallel to an optical axis of the lens 30. With this arrangement, the path of air flow defined from the inlet port 6 to the outlet port 7 is not straight.

Figure 4:
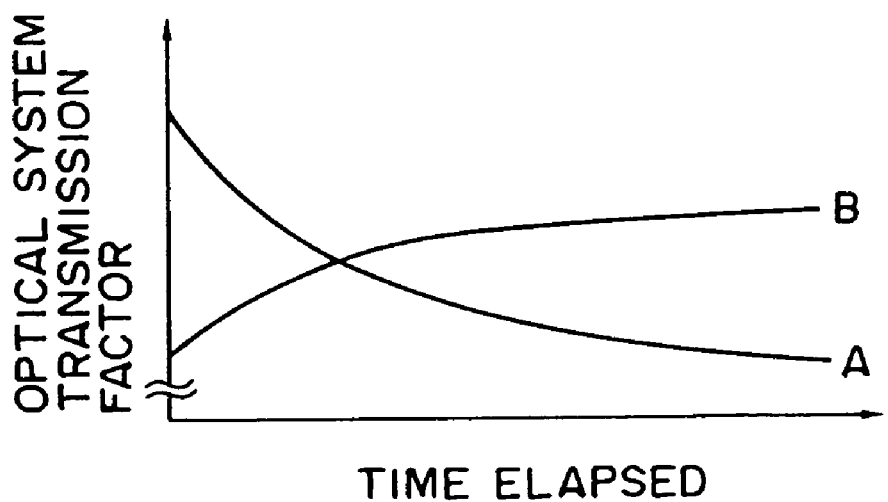

FIG. 4 illustrates changes in the transmission factor with respect to time, in a case where the apparatus is left without laser projection and gas purging. With the elapse of time when the apparatus is out of operation, the transmission factor of the optical system as a whole gradually decreases (curve A) or increases (curve B) and, at a certain level, it becomes substantially constant. Whether the transmission factor decreases or increases is determined, depending on the characteristic of the optical system.

The results shown in FIG. 4 may be attributable to the phenomenon that the moisture contained in the ambient gas within the optical system is gradually deposited on the lens surfaces by which the transmission factor is changed.

In this embodiment, dry $N_2$ or He gas or dry air, for example, is supplied from the purging inlet port, and the gas is then collected from the gas outlet port. Thus, the ambient gases inside the optical systems can be continuously purged, by which the humidity inside the optical system can be lowered and a variation in the transmission factor can be prevented. As a result of this, the transmission factor of the optical system is substantially unchanged with the elapse of time.

Figure 5:
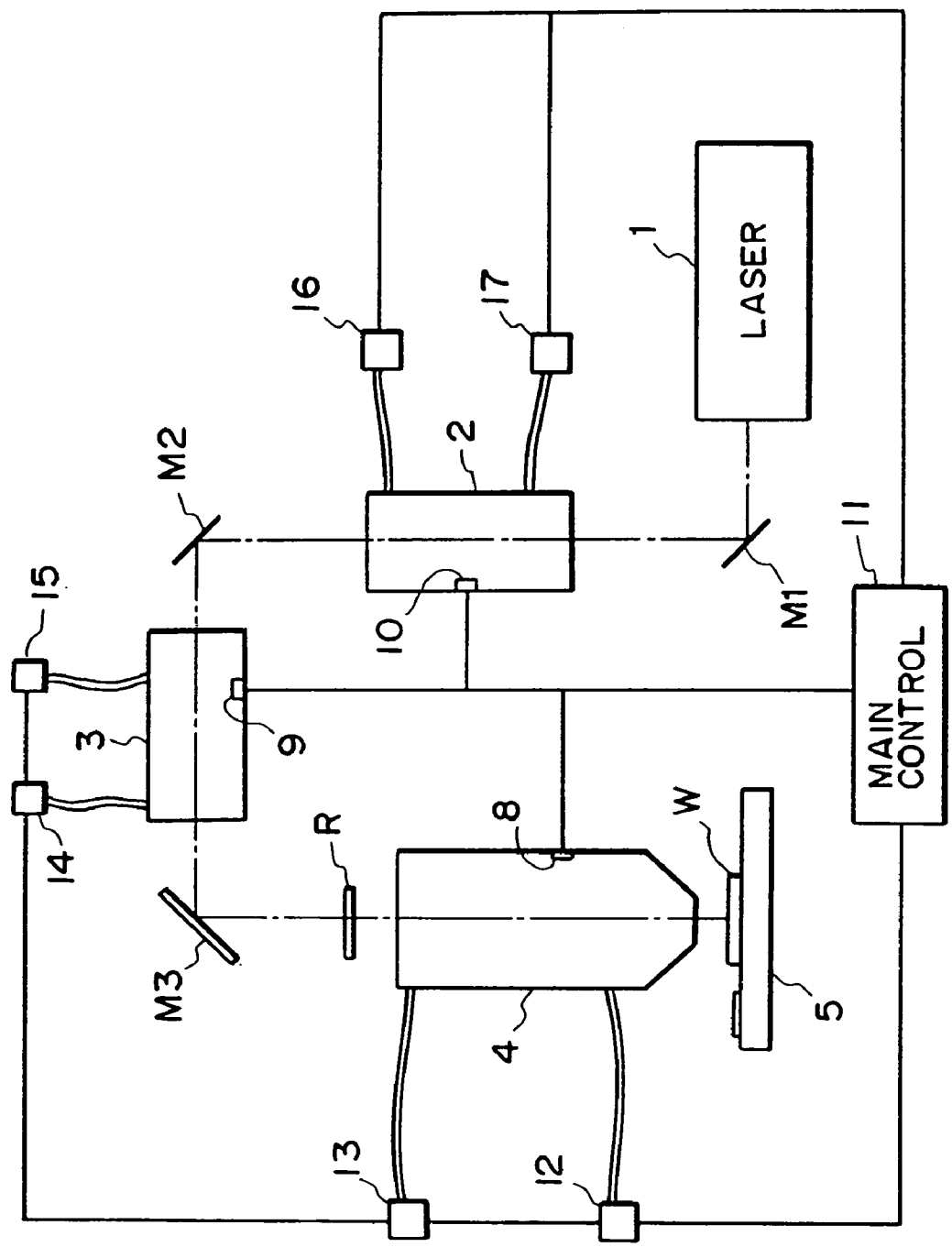
FIG. 5 is a schematic view of a general structure of a projection exposure apparatus according to a second embodiment of the present invention.

FIG. 5 is a schematic view of a general structure of a projection exposure apparatus according to another embodiment of the present invention. In FIG. 5, the elements corresponding to those of FIG. 1 are denoted by like numerals. Thus, a description thereof will be omitted.

In FIG. 5, denoted by 8, 9 and 10 are hygrometers disposed inside the optical systems, respectively, by which the level of replacement inside the optical systems can be monitored continuously. Purging tubes are provided with servo valves 12–17, as illustrated, which can be opened and closed as controlled by a main controller 11. These valves are normally closed.

If any of the monitored replacement levels (levels of hygrometers 8, 9 and 10) is above a specified level as inputted into the main controller 11 beforehand, the main controller 11 supplies a gas purging start signal to a corresponding one or ones of the servo valves 12 and 13, 14 and 15, or 16 and 17, to open it, whereby gas purging is initiated. If the replacement level becomes smaller than a particular level for completion detection as inputted into the main controller 11 beforehand, the main controller 11 applies a gas purging completion signal to the corresponding servo valve to close the same. By this, gas purging is stopped. The gas purging may be completed in response to the elapse of a predetermined time from the gas purging start. Alternatively, completion detection based on replacement level and completion detection responsive to an elapse of a predetermined time may be used in combination.

Figure 6:
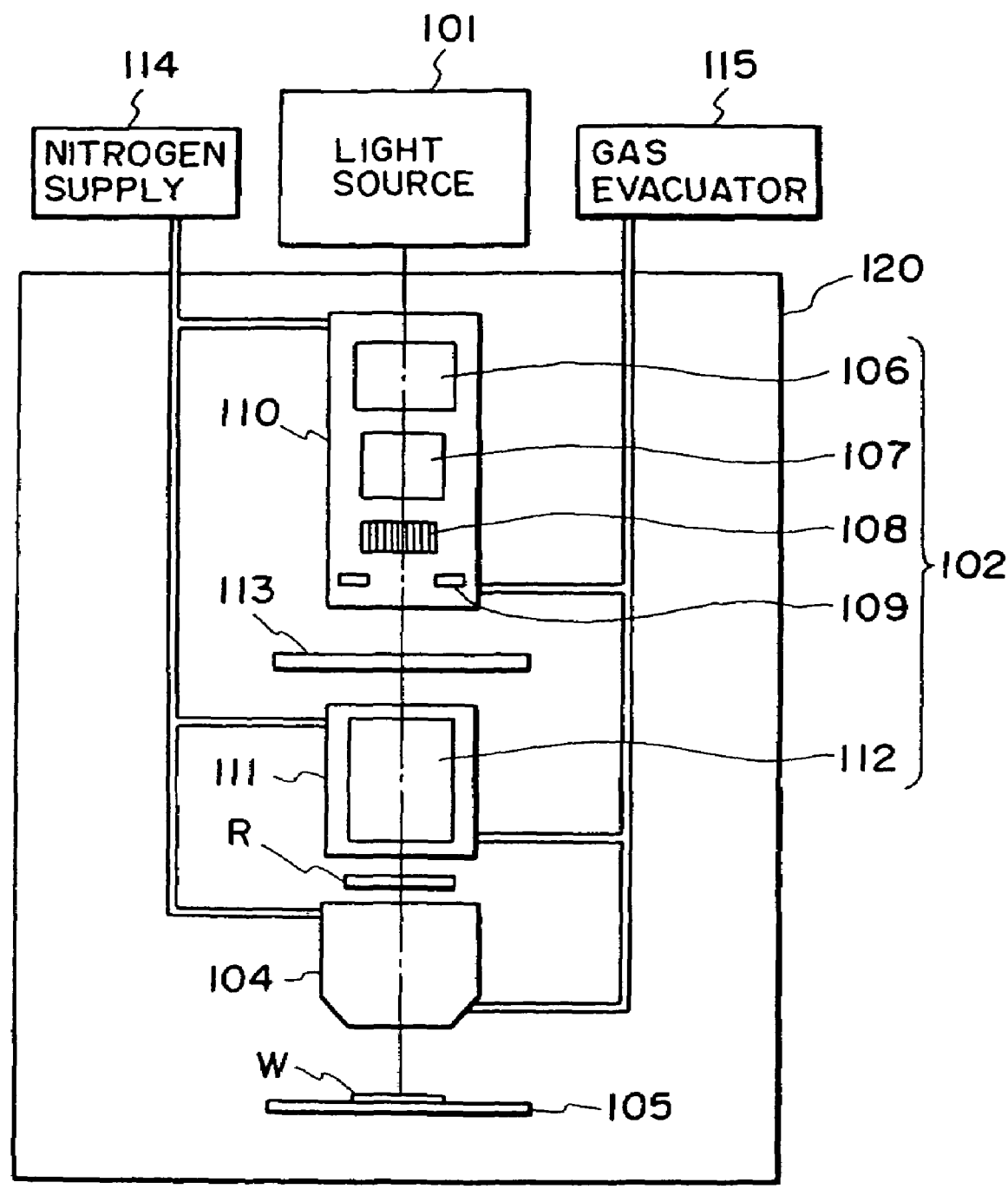
FIG. 6 is a schematic view of a general structure of an exposure apparatus according to a third embodiment of the present invention.

FIG. 6 is a schematic view of the structure of an exposure apparatus according to a third embodiment of the present invention. This exposure apparatus includes an exposure light source 101, an illumination optical system 102, a projection optical system 104, a reticle (mask) R, a photosensitive substrate (wafer) W, and a substrate stage 105, on which the wafer W is placed. Among these components, the exposure apparatus major assembly, excluding the exposure light source 101, is accommodated in a chamber 120, which is controlled at a constant temperature.

The exposure light source 101 may comprise an excimer laser of KrF (wavelength 248 nm), ArF (wavelength 193 nm) or $F_2$ (wavelength 157 nm), for example, for producing pulse light in the ultraviolet region. In place of such an excimer laser, an Hg lamp may be used as an exposure light source, and i-line (wavelength 365 nm) may be used as exposure light.

The illumination optical system 102 comprises a number of optical elements such as lenses or mirrors, and it serves to illuminate an illumination region on the reticle R with uniform illuminance, with the exposure light from the exposure light source 101. This illumination optical system 102 is accommodated in two casings 110 and 111, which are sealingly closed. The illumination optical system 102 includes a beam shaping optical system 106, a zooming optical system (enlarging system) 107, a fly's eye lens 108 as an optical integrator, and an illumination system aperture stop 109 disposed at the exit of the fly's eye lens 108. The second casing 111 contains a condenser lens 112. Between the first casing 110 and the second casing 111, there is a blind 113 for determining the shape of the illumination region on the reticle R. At the portions of the first and second casings 110 and 111, which are on the path of exposure light (illumination light), there are transparent glass windows.

Details of the structural portions of the illumination optical system, as well as the functions of them, will be described. The exposure light emitted from the exposure light source 101 passes through the beam shaping optical system 106, by which the beam shape is changed from an oblong shape to a square shape. Then, the light enters the zooming optical system (enlarging system) 107, whereby the exposure light is enlarged to a required size. The light then enters the fly's eye lens 108. The exit side end face of the fly's eye lens 108 is in an optically conjugate relation with the light source 2, and a secondary light source plane is defined there. Light rays emitted from the secondary light sources (elements) go through the aperture of the aperture stop 109 and the blind 113, by which the illumination region on the reticle R is restricted. The exposure light impinging on the condenser lens 112 is collected, and then it illuminates the reticle R, which is placed in a positional relation of Fourier transformation with respect to the secondary light source plane. Thus, the individual elements of the fly's eye lens 108 illuminate the reticle R through the condenser lens 112, such that they serve as an optical integrator. As a result, the pattern region of the reticle R is illuminated uniformly.

The projection optical system 104 comprises a lens barrel and plural lens elements supported by the barrel. The projection optical system 104 has a pupil plane which is in an optically conjugate positional relation with the secondary light source plane and also in a positional relation of Fourier transformation with respect to the reticle surface. Illumination light diffracted by the pattern on the reticle R enters the projection optical system 104, and diffraction light passing through an aperture stop (not shown), defined at the pupil plane of the projection optical system 104, serves to protect the pattern of the reticle R onto the wafer W, which is disposed at a position optically conjugate with the reticle R.

The substrate stage 105 for holding the wafer W can be moved two-dimensionally by means of a driving system, not shown. Thus, by performing exposures while stepping the substrate stage 105, the pattern of the reticle R can be transferred to different shot areas on the wafer W sequentially.

In the projection exposure apparatus of this embodiment as described above, a nitrogen supplying device 114 is connected to the casings 110 and 111 of the illumination optical system and to the projection optical system 104 through tubes, for supplying a dry inert gas (nitrogen $N_2$ gas) so as to keep a low "oxygen" density inside the casings 110 and 111 and the projection optical system 104. Also, a gas evacuating device 115 is connected to them through tubes, for discharging the inside air or gases in them. Additionally, the nitrogen supplying device 114 and the gas discharging device 115 are connected to the inside of each barrel, constituting an optical system accommodated in the casing and having a number of lenses therein, so that a low oxygen density is kept constantly also inside the barrel.

Figure 7:
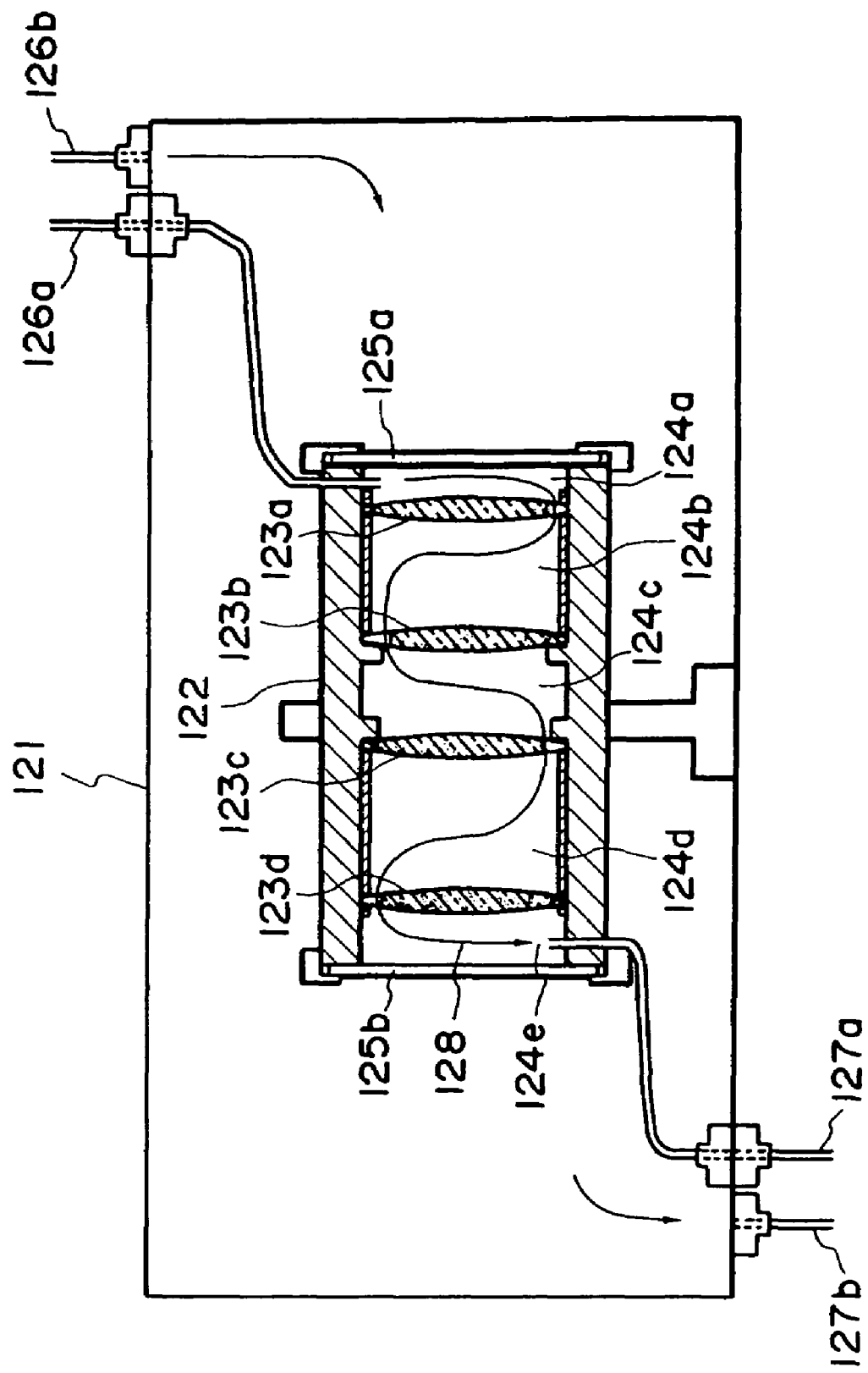
FIG. 7 is a schematic view for explaining an example of an inside structure of a casing and barrel of the FIG. 6 embodiment.

FIG. 7 is an enlarged view showing an example of a casing 121 and a barrel 122 accommodated in the casing 121. As shown in FIG. 7, the barrel has lenses 123a–123d disposed therewithin. There are spaces 124a–124e as separated by these lenses 123a–123d. Mounted at the opposite ends of the barrel 122 are sheet glass members 125a and 125b as windows, and they are demountably mounted. The inside space of the casing 121 and the inside space of the barrel 122 are communicated with a nitrogen supplying device, not shown, through tubes 126a and 126b, and also they are communicated with a gas discharging device, not shown, through tubes 127a and 127b. By continuous or interrupted nitrogen gas replacement, the oxygen density within the casing 121 and the barrel 122 can be maintained at a low level. However, the spaces separated within the barrel 122 are in a closed state, and it can be considered that there is substantially no flow of gas or air between them.

Figure 8:
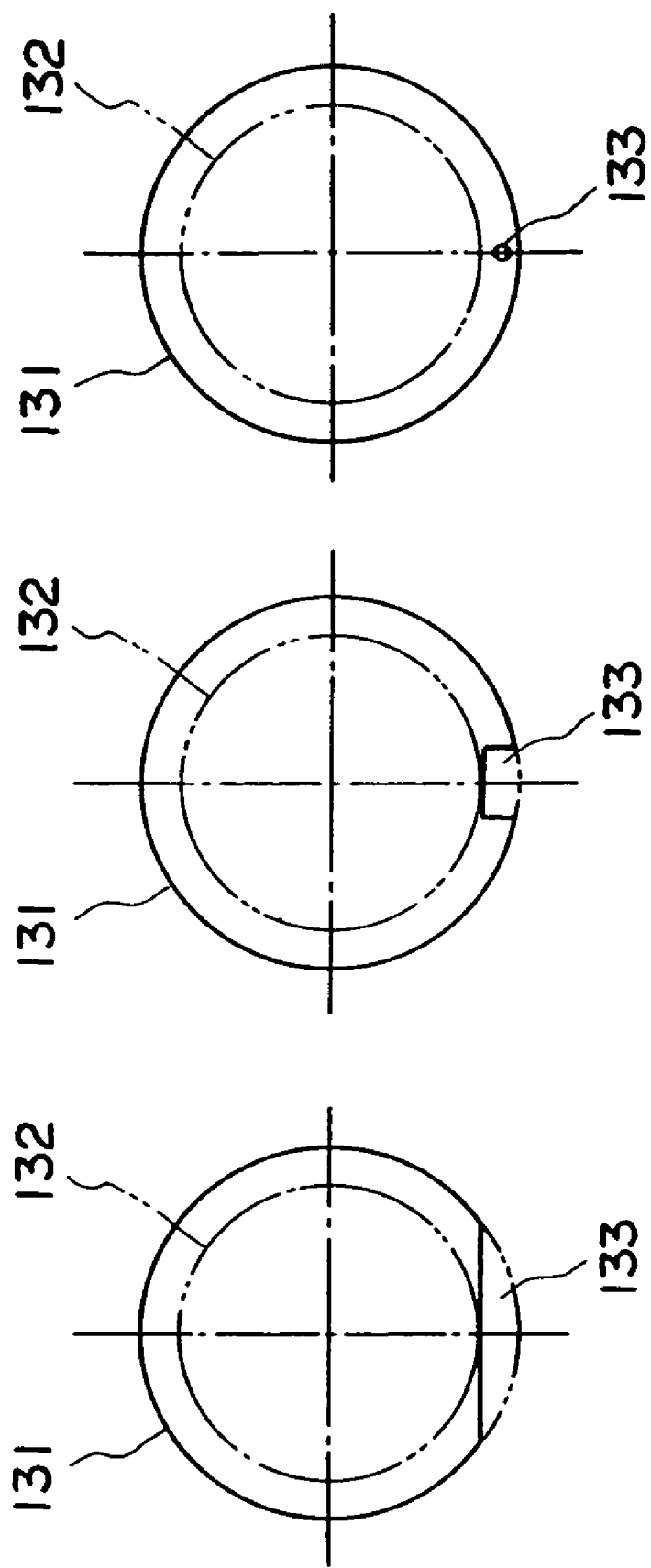
FIG. 8 is a schematic view of lenses to be used in the FIG. 6 embodiment, with notches outside the effective light flux.

In consideration of this, in the present embodiment, for circulation of nitrogen within these spaces, end portions of the lenses 123a–123d outside the effective light flux are removed to positively provide a flow passage there. FIG. 8 shows examples wherein lens portions outside the effective light flux are removed. In FIG. 8, denoted at 131 is a lens, denoted at 132 is the effective light flux range, and denoted at 133 is a notch.

As shown in FIG. 7, the lenses 123a–123d with notches are disposed with a shift so that the flow path does not extend along a straight line. This ensures that the nitrogen gas can be supplied into the whole spaces 124a–124e uniformly. The projection lens 104 may have a similar structure, by which nitrogen circulation within the whole spaces separated by the lenses can be accomplished.

In accordance with the embodiments of the present invention as described above, a flow path for circulation of inert gas such as nitrogen within the spaces separated by lenses inside a barrel can be provided with a simple design and without an increase in the size of a barrel or lens.

Next, an embodiment of a device manufacturing method, which is based on an exposure apparatus or exposure method such as described above, will be explained.

Figure 9:
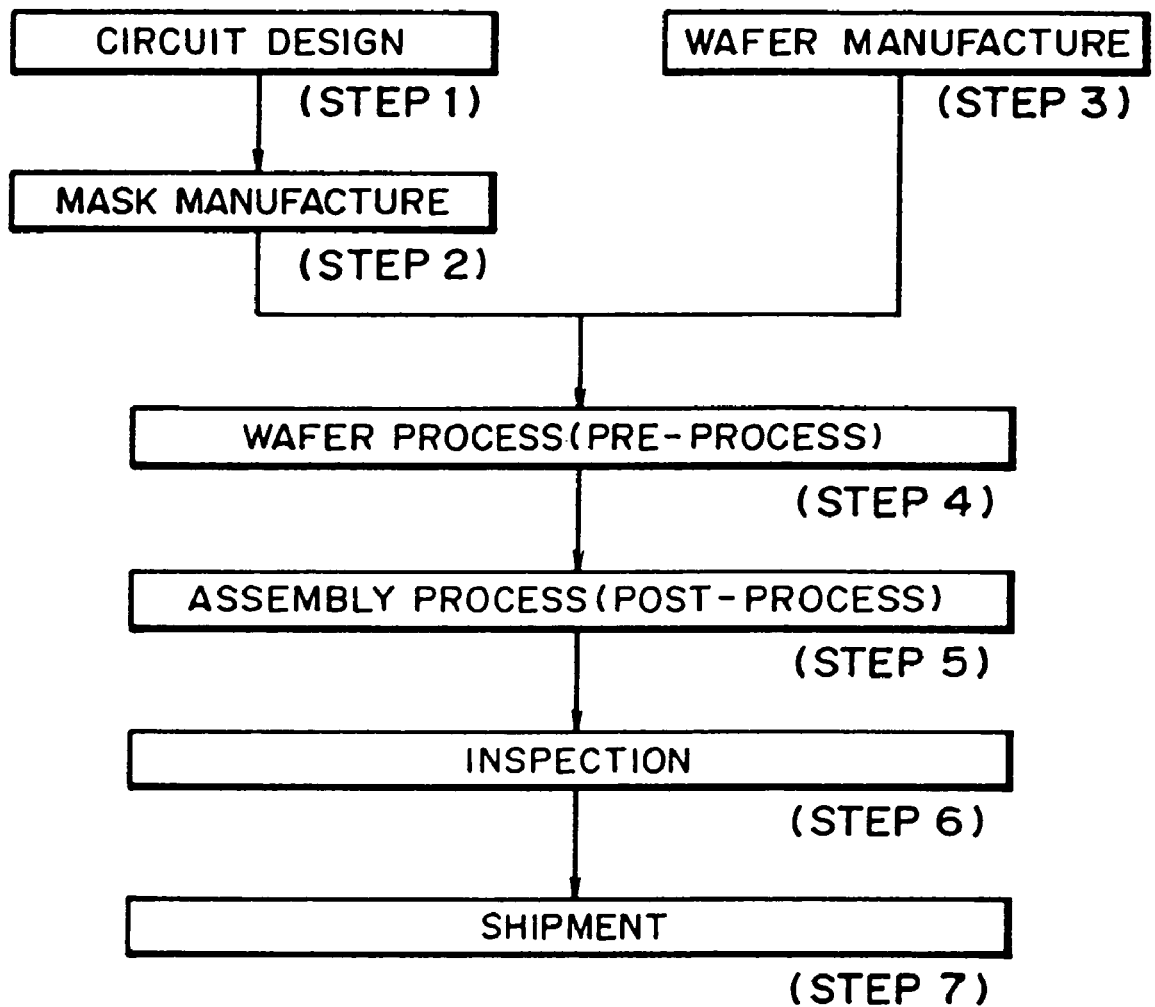
FIG. 9 is a flow chart of microdevice manufacturing processes.

FIG. 9 is a flow chart of a procedure for the manufacture of microdevices such as semiconductor chips (e.g., ICs or LSIs), liquid crystal panels, CCDs, thin film magnetic heads or micro-machines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a pre-process, wherein, by using the so prepared mask and wafer, circuits are practically formed on the wafer through lithography. Step 5 subsequent to this is an assembling step, which is called a post-process, wherein the wafer having been processed by step 4 is formed into semiconductor chips. This step includes an assembling (dicing and bonding) process and a packaging (chip sealing) process. Step 6 is an inspection step wherein an operation check, a durability check, and so on, for the semiconductor devices provided by step 5, are carried out. With these processes, semiconductor devices are completed and they are shipped (step 7).

Figure 10:
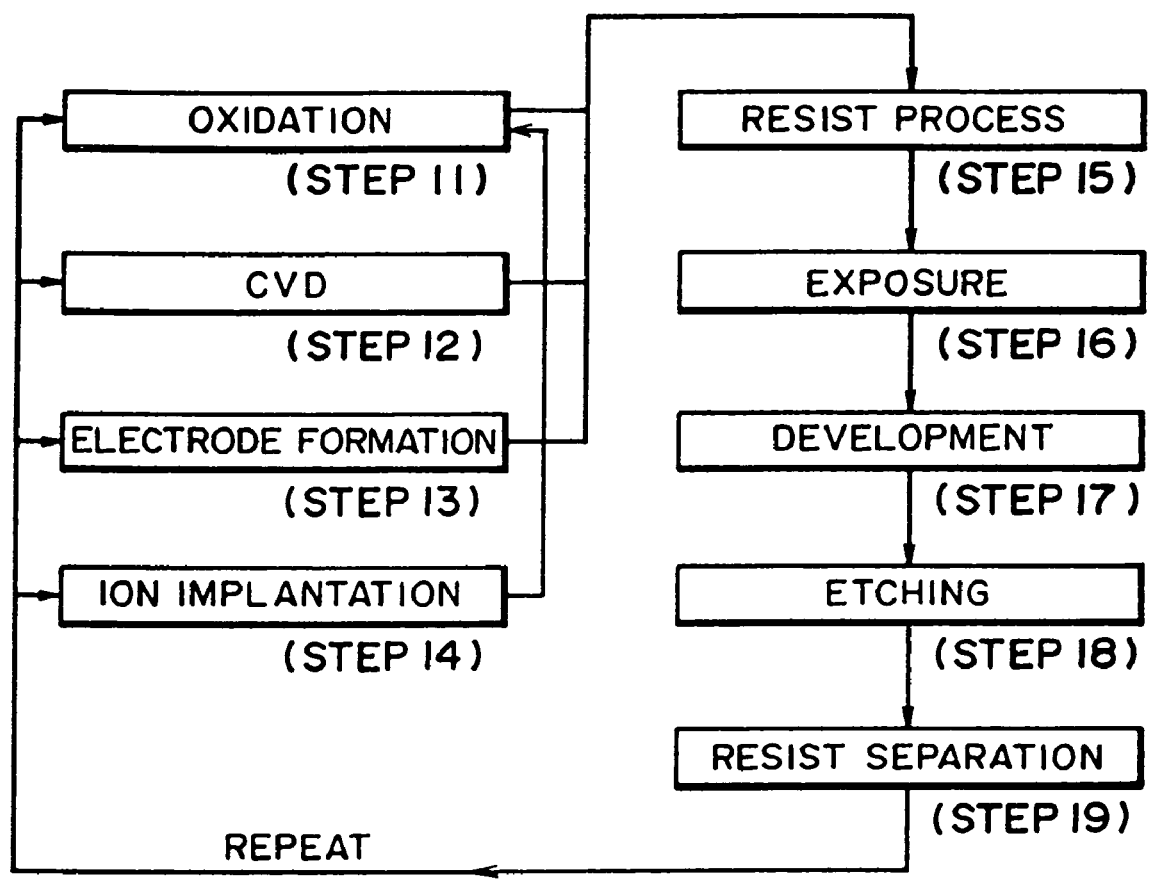
FIG. 10 is a flow chart for explaining details of a wafer process included in the procedure of FIG. 9.

FIG. 10 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for exposing a substrate to light through a reticle, said apparatus comprising:
    a barrel configured to house therein a lens that directs the light;
    a first lens unit, said first lens unit separating a first space and a second space in said barrel from each other, said first lens unit having a first aperture and a second aperture;
    a second lens unit, said second lens unit separating the second space and a third space in said barrel from each other, said second lens unit having a third aperture and a fourth aperture;
    a first piping configured to supply a gas to said first space; and
    a second piping configured to discharge a gas out of said third space,
    wherein said first to fourth apertures are disposed in an order of first aperture, third aperture, second aperture, and fourth aperture, with respect to a rotational direction about an optical axis of said first and second lens units.

2. A device manufacturing method, comprising the steps of:
    exposing a substrate to light by use of an exposure apparatus as recited in claim 1;
    developing the exposed member substrate; and
    processing the developed substrate to produce a device.

3. An apparatus according to claim 1, further comprising a supplier configured to supply a gas through said first piping, and an exhauster configured to discharge a gas through said second piping.

* * * * *